United States Patent [19]

Spratt et al.

[11] Patent Number: 4,962,053
[45] Date of Patent: Oct. 9, 1990

[54] BIPOLAR TRANSISTOR FABRICATION UTILIZING CMOS TECHNIQUES

[75] Inventors: David Spratt; Rajiv R. Shah, both of Plano, Tex.

[73] Assignee: Texas Instruments Incorporated, Dallas, Tex.

[21] Appl. No.: 296,493

[22] Filed: Jan. 9, 1989

Related U.S. Application Data

[63] Continuation of Ser. No. 8,906, Jan. 30, 1987, abandoned.

[51] Int. Cl.$^5$ .................................. H01L 21/255
[52] U.S. Cl. .................... 437/31; 437/186; 437/162; 437/33; 437/233; 357/34; 148/DIG. 11
[58] Field of Search ............ 437/31, 32, 33, 162, 437/186, 193, 233, 238, 51, 54, 59; 357/34, 35, 59 H; 156/653, 657; 148/DIG. 11

[56] References Cited

U.S. PATENT DOCUMENTS

| 4,157,269 | 6/1979 | Ning | 437/239 |
|---|---|---|---|
| 4,341,009 | 7/1982 | Bartholomew et al. | 29/571 |
| 4,381,953 | 5/1983 | Ho | 437/31 |
| 4,492,008 | 1/1985 | Anantha et al. | 29/571 |
| 4,536,945 | 8/1985 | Gray et al. | 29/571 |
| 4,546,536 | 10/1985 | Arantha | 437/31 |
| 4,637,125 | 1/1987 | Iwasaki | 437/76 |
| 4,717,686 | 1/1988 | Jacobs et al. | 437/56 |
| 4,737,472 | 4/1988 | Schaber et al. | 437/59 |
| 4,752,589 | 6/1988 | Schaber | 437/31 |

FOREIGN PATENT DOCUMENTS

| 1203641 | 8/1983 | Canada | 356/127 |
|---|---|---|---|
| 0097379 | 1/1984 | European Pat. Off. | 21/82 |
| 0151347 | 8/1985 | European Pat. Off. | 21/82 |
| 0170250 | 2/1986 | European Pat. Off. | 21/225 |

OTHER PUBLICATIONS

Sakurai, "A New Transistor . . . ", Japanese J. of Appl. Phys., vol. 19, (1980), Supplement 19-1, pp. 181-185.
Miyamoto et al., "A High Speed 64K CMOS Ram with Bipolar Sense Amplifiers", IEEE Journal of Solid-State Circuits, vol. SC-19, No. 5, Oct. 1984, pp. 557-563.
Watanabe et al., "High Speed BICMOS VLSI Technology with Buried Twin Well Structure", IEEE, pp. 423-426.
Walczyk et al., "A Merged CMOS/Bipolar VLSI Process", IEEE, pp. 59-62.
Alvarez et al., "2 Micron Merged Bipolar-CMOS Technology", IEDM, 1984, pp. 761-764.
J. L. de Jong et al., "Electron Recombination at the Silicided Base Contact of an Advanced Self-Aligned Poly-Silicon Emitter", IEEE 1988 Bipolar Circuits & Technology Meeting, pp. 202-205.
Y. Koh et al., "Self-Aligned T$_i$S$_{i2}$ for Bipolar Applications", American Vacuum Society, 1985, pp. 1715-1723.

Primary Examiner—Olik Chaudhuri
Assistant Examiner—Kevin McAndrews
Attorney, Agent, or Firm—B. Peter Barndt; James T. Comfort; Melvin Sharp

[57] ABSTRACT

Disclosed is a bipolar transistor and a method of fabrication thereof compatible with MOSFET devices. A transistor intrinsic base region (54) is formed in the face of a semiconductor well (22), and covered with a gate oxide (44). The gate oxide (44) is opened, and doped polysilicon is deposited thereover to form a polyemitter structure (68) in contact with the base region (54). Sidewall oxide (82, 84) is formed on the polyemitter structure (60). A collector region (90) and an extrinsic base region (100) are formed in the semiconductor well (22) and self aligned with respect to opposing side edges of the polyemitter sidewall oxide (82, 84).

20 Claims, 4 Drawing Sheets

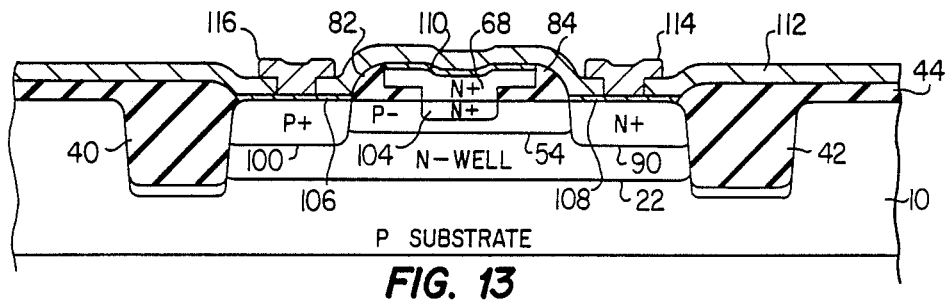
FIG. 13
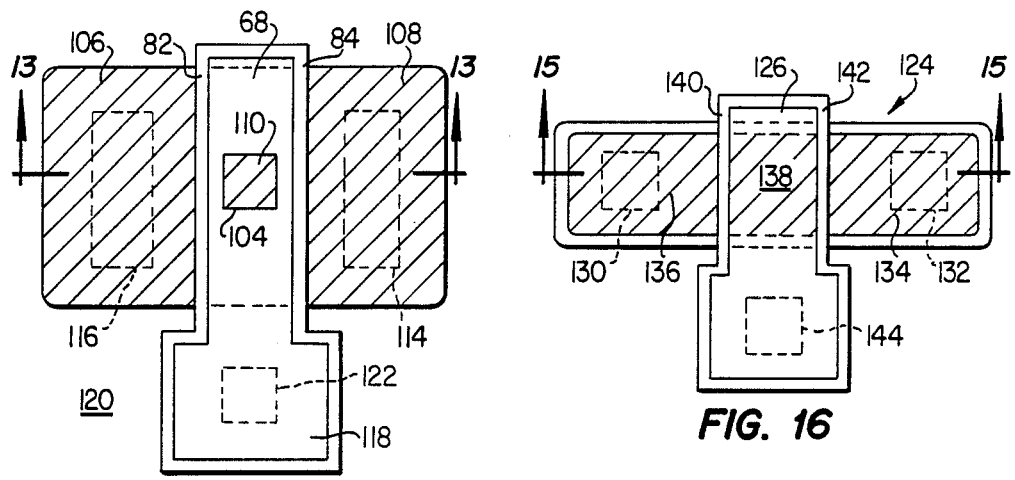
FIG. 14
FIG. 16
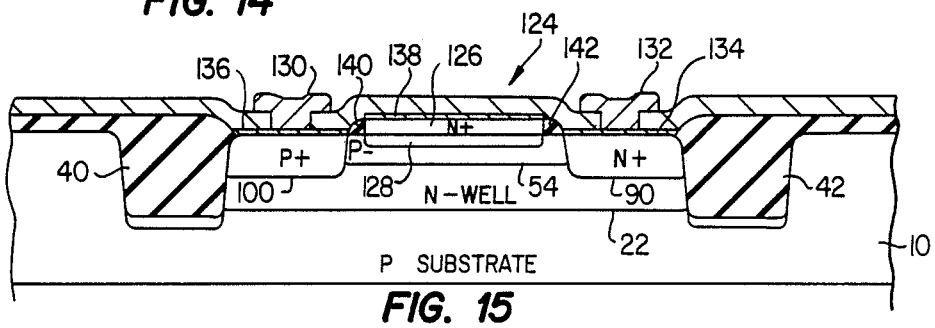
FIG. 15
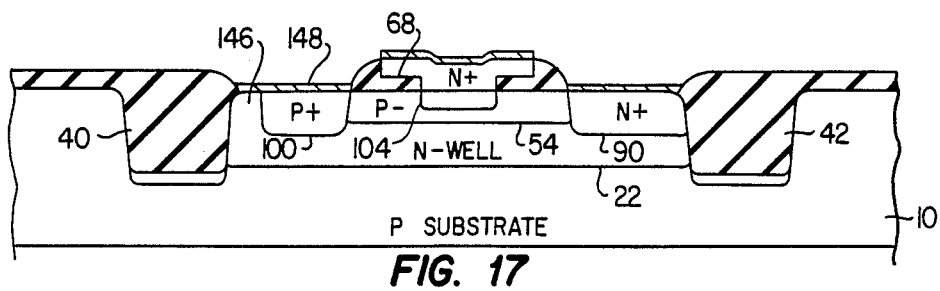
FIG. 17

BIPOLAR TRANSISTOR FABRICATION UTILIZING CMOS TECHNIQUES

This application is a continuation of application Ser. No. 07/008,906, filed Jan. 30, 1987, now abandoned.

RELATED APPLICATION

"Integrated Bipolar and CMOS Transistor Fabrication Process", by Rajiv R. Shah and Toan Tran, Serial No. 8,910, filed concurrently herewith and "SELF-ALIGNED NPN BIPOLAR TRANSISTOR BUILT IN A DOUBLE POLYSILICON CMOS TECHNOLOGY" by Kueing-Long Chen, filed June 6, 1987 Serial No. 57,586.

TECHNICAL FIELD OF THE INVENTION

The present invention relates in general to silicon semiconductor processing, and more particularly relates to the fabrication of bipolar transistor structures utilizing CMOS fabrication techniques.

BACKGROUND OF THE INVENTION

Bipolar transistors and MOSFET transistors represent two different families of semiconductor devices which each have distinct advantages over the other. The operation and structure of these semiconductor families have traditionally differed, and thus have experienced different development routes to exploit the individual advantages. For example, bipolar transistors are well suited for use in high power, high speed, digital and analog applications. On the other hand, MOSFET transistor devices, including PMOS and NMOS transistors which form CMOS devices, are well suited for low power and high packing density applications.

The electrical operation of a bipolar transistor involves both minority and majority carriers, and has traditionally been fabricated in a manner different from CMOS transistor circuits which depend upon current flow involving majority carriers. In addition, because the operating characteristics of bipolar transistors depend upon the lateral geometry, as well as the vertical geometry of semiconductor regions, the fabrication thereof has traditionally taken a different route then that of CMOS transistors, which are lateral surface-operating devices.

With the current trend toward a large scale integration of semiconductor circuits, it has become advantageous to integrate bipolar circuits and MOSFET circuits into the same chip. In this manner, many MOSFET circuits can be arranged in a small wafer area and utilized to perform an electrical function, while the current driving capabilities of bipolar transistors can be used as the drivers for such MOSFET circuits. Many other applications exist in which the advantages of both MOSFET and bipolar devices can be combined into a single integrated circuit chip to provide an overall improved performance.

The initial integration of bipolar circuits and MOSFET circuits involved conventional process steps to form the MOSFET devices, as well as conventional steps to form the bipolar devices. Very few processing steps were shared between the fabrication of each such device type, and thus the overall process was complex, lengthy, costly and susceptible to low production yields. Because of the increased importance of integrating bipolar and CMOS devices, many attempts have been made to develop processes whereby various structures of both types of devices can be fabricated simultaneously such that the total number of processing steps are minimized, and the technologies are brought into correspondence, without compromising the performance or advantages inherent in each type of device.

From the foregoing it can be appreciated that a need exists for an improved bipolar transistor device which can be fabricated with process steps highly compatible with those of MOSFET devices. There is an associated need for a bipolar device, and method of fabrication thereof, which results in a transistor occupying less wafer area and improved performance.

SUMMARY OF THE INVENTION

In accordance with the present invention, the disclosed bipolar device structure and method of fabrication thereof reduces or eliminates the disadvantages and the shortcomings associated with the corresponding prior art devices and processing techniques. According to the invention, various features of the bipolar device are fabricated at the same time as structures of MOSFET devices. Not only are the process steps of the invention optimized in forming bipolar and MOSFET devices, but the fabrication of a small area bipolar transistor is also made possible.

In the preferred form of the invention, a bipolar transistor N-well is formed in a P-substrate in a manner similar to the formation of a semiconductor well utilized in forming a P-channel MOSFET device. The N-wells are isolated by a thick field oxide or trenches using conventional silicon processing techniques. A thin gate oxide is then grown over the surface of the wafer, covering the bipolar and MOSFET transistor wells. A thin layer of polysilicon is then deposited over the thin gate oxide. The bipolar transistor N-well is patterned, and implanted to form a P-type intrinsic base region. An opening is formed through the thin polysilicon and gate oxide to the intrinsic base region. A layer of polycrystalline silicon (hereinafter polysilicon) is deposited over the surface of the wafer and implanted to form gate conductors for the MOSFET transistors, and a polyemitter structure for the bipolar transistor. The doped polysilicon makes contact with the intrinsic base region through the gate oxide opening. The gate and polyemitter structures are further processed by depositing thereover a silicon dioxide (hereinafter silicon oxide) insulation and anisotropically etching the same downwardly to form oxide sidewalls on the polysilicon emitter and gate structures. The sidewall oxide on the polysilicon gate structures facilitates the formation of a lightly doped drain region in the N-channel MOSFET transistor. In the bipolar transistor, the sidewall oxide the polyemitter facilitates the spacing of a collector region and an extrinsic base region from the semiconductor emitter region.

The wafer is masked, patterned and implanted to form an N+ collector region in the bipolar transistor area, and source and drain regions in the NMOS transistor area. In like manner, the wafer is processed to form implanted P+ regions, defining an extrinsic semiconductor base region in the bipolar transistor, and corresponding source and drain regions in the PMOS transistors. The source and drain regions of the MOSFET devices are self aligned to the corresponding gate conductors, and the collector and extrinsic base of the bipolar device are self aligned to the polyemitter.

In accordance with MOSFET fabrication techniques, the source, drain and gate conductor structures are silicided, together with the extrinsic base, collector and polyemitter structures of the bipolar transistor. During wafer processing, the temperature thereof is elevated sufficiently to drive the N-type impurities in the polyemitter through the gate oxide opening and into the base region. A buried emitter is thereby formed. Subsequent insulation, metalization and passivation processing is conducted to connect the various transistor structures together and to protect the completed wafer from the environment.

In another embodiment of the invention, a walled emitter structure, rather than a nested structure, can also be constructed using processing steps compatible with MOSFET device fabrication. With the walled type of emitter structure, a highly compact device can be constructed.

In yet another embodiment of the invention, a portion of the N-well area of the bipolar transistor is formed at the face of the semiconductor body adjacent a portion of the extrinsic base. Formed over the contiguous N and P semiconductor areas is a titanium silicide, thereby forming a Schottky barrier diode. The Schottky diode is constructed in parallel across the base and collector junction of the bipolar transistor, thereby resulting in a Schottky-clamped transistor.

BRIEF DESCRIPTION OF THE DRAWINGS

Further features and advantages will become more apparent from the following and more particular description of the various embodiments of the invention, as illustrated in the accompanying drawings in which like reference characters generally refer to the same parts, areas and regions throughout the views, and in which:

FIGS. 1-13 are cross-sectional views of a semiconductor wafer which illustrate the various fabrication steps according to the invention;

FIG. 14 is a top view, or layout, of a nested emitter bipolar device illustrated in FIG. 13;

FIG. 15 is a cross-sectional view of a bipolar device employing a walled emitter structure;

FIG. 16 is a top view of the walled emitter bipolar transistor of FIG. 15; and

FIG. 17 is a cross-sectional view of a Schottky-clamped bipolar transistor constructed according to the principles and concepts of the invention.

DETAILED DESCRIPTION OF THE INVENTION

As described herein, the invention is disclosed in terms of the fabrication of an exemplary NPN bipolar transistor. Reference will be made to corresponding conventional steps for fabricating CMOS transistors, the particularities of which are not shown pictorially herein.

Figure 1:
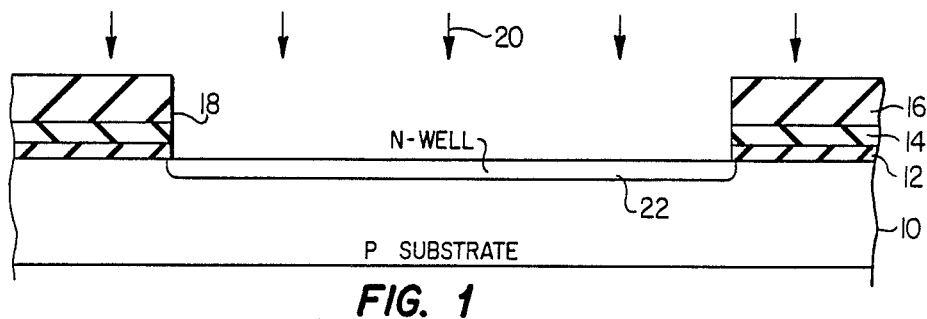

Turning now to the drawings, and particularly to FIG. 1, the fabrication of a bipolar transistor according to the invention is commenced by selecting a semiconductor substrate 10 having electrical characteristics suitable for fabricating both bipolar and CMOS transistors. A silicon substrate material of a P-type conductivity, a <100> crystal orientation, and a conductivity of about 10 ohm-centimeter is preferable. A local thin thermal silicon oxide 12 is grown over the surface of the substrate 10. A thin silicon nitride layer 14 is deposited on the wafer, such as by a low pressure chemical vapor deposition (LPCVD) process. Covering the silicon nitride 14 is a layer of photoresist material 16 which is spun over the surface of the wafer, and patterned to define an opening 18 for locating an N-well. Similar openings would be defined in the photoresist 16 for forming N-wells associated with PMOS transistors. A portion of the silicon nitride layer 14 and silicon oxide layer 12 are removed by conventional etching processes in the area defined by the mask opening 18.

An ion implant 20 is next conducted, using an N-type impurity, for forming an N-well 22 in the mask openings of the substrate 10. The implant is conducted at an energy level sufficient to form a shallow N-well 22. Phosphorus may be used as the N-type impurity implant at a dosage of about 5E12 atoms/cm2. Other N-type impurities and dosages may be used with satisfactory results.

Figure 2:
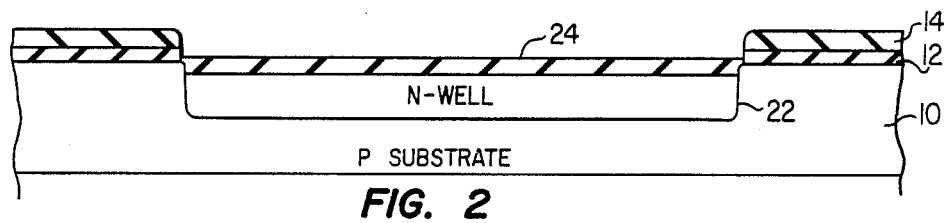

As shown in FIG. 2, the wafer is subjected to a silicon oxidizing environment in which a thin silicon oxide layer 24 is grown over the N-well area 22. The photoresist mask 16 is shown removed, and the N-well 22 has been diffused downwardly, due to the temperature used in growing the N-well oxide 24. The thin silicon oxide and nitride layers 12 and 14 are then removed.

Figure 3:
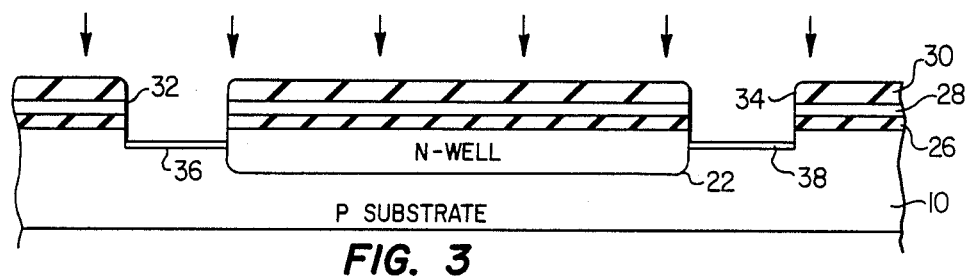

As illustrated in FIG. 3, a new layer of silicon oxide 26 is grown over the surface of the substrate 10, and comprises a buffer oxide. An oxidation mask comprising a deposited silicon nitride layer 28 is formed over the oxide layer 26. A layer of photoresist material 30 is spread over the surface of the wafer and patterned to define openings 32 and 34 circumscribing the N-well 22. The silicon nitride 28 and oxide 26 are removed in the area defined by the openings using conventional etching techniques. A portion of the silicon substrate 10 is also etched to form a recess in the area defined by the mask opening 32 and 34. The mask openings 32 and 34 define areas in which a thick field oxide will be formed, and thus the substrate material 10 is etched downwardly to the extent desired for forming sufficiently thick field oxide recessed from the surface of the substrate 10.

Figure 4:
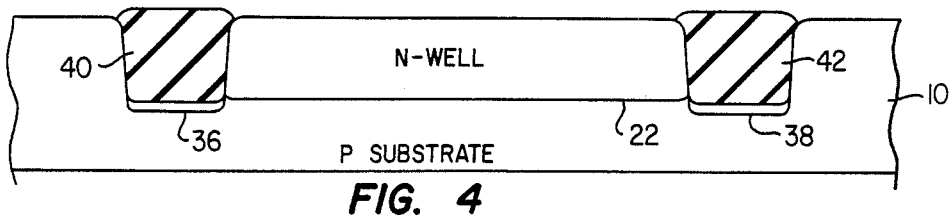

The wafer is ion implanted with boron to form P-type channel stop areas 36 and 38. The wafer is subjected to a high temperature steam ambient for growing a thick field oxide in the unmasked areas of the substrate 10. Particularly, the silicon substrate material located under the openings 32 and 34 is consumed until a thick field oxide has been grown. The thick field oxide 40 and 42 is depicted in FIG. 4, after the silicon oxide layer 26, the nitride layer 28 and the photoresist mask 30 have been removed.

The foregoing illustrates one method of forming N-wells suitable for use in connection with bipolar transistors and MOSFET transistors. As an alternative, heavily doped N-type buried layers can be formed within the substrate 10, with an N-type epitaxial layer of semiconductor material deposited thereover. Thick field oxide regions can be formed in the epitaxial layer, similar to that described above, for providing lateral isolation between circuits. Moreover, P-wells can be formed in other areas of the wafer for use in connection with NMOS transistors.

Figure 5:
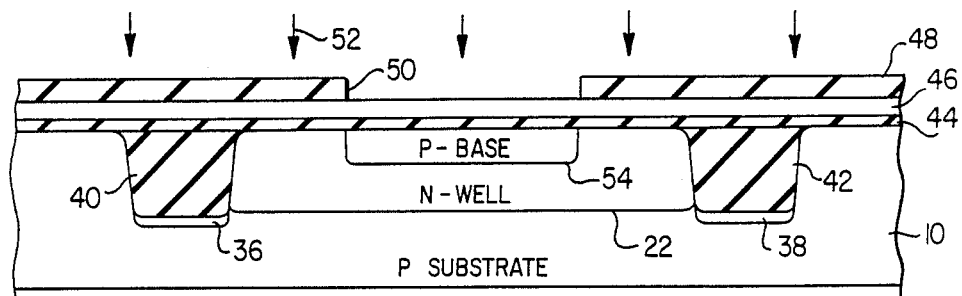

With reference now to FIG. 5, a thin high quality gate oxide 44 is grown on the surface of the silicon wafer. A high quality gate oxide can be formed by first growing a thin sacrificial oxide layer, oxidizing it together with any silicon nitride deposits, and then removing the oxides. This pregate or sacrificial oxide, eliminates the Kooi white-ribbon effect which is characteristic of silicon nitride deposits formed in undesired areas of the wafer. In any event, the high quality gate oxide 44 is grown on the silicon wafer after the removal of the pregate oxides and nitrides have been removed. The gate oxide 44 is formed to a depth desired for separating the gate conductors from the transfer channels of the MOSFET transistors. Deposited over the gate oxide 44 is a layer of polysilicon 46. The polysilicon layer 46 is thin, being about 1,000 angstroms thick. A photoresist mask 48 is spun over the surface of the wafer, and patterned to define an opening 50 for forming a semiconductor intrinsic base region in the N-well 22. Preferably, the masked opening 50 is formed intermediate the thick field oxide regions 40 and 42. The polysilicon 46 functions primarily as a passivation layer for protecting contamination from entering the gate oxide layer 44. However, the polysilicon 46 should be thin enough to allow ion implantation therethrough.

A boron implant 52 is conducted at a dosage of about 1E14 atoms/cm2. The implant 52 is conducted in a manner to place the impurity near the surface of the N-well 22. The dosage can be adjusted for the desired transistor gain ($h_{fe}$) and breakdown voltage of the bipolar transistor. Higher breakdown voltages may require deeper base implant regions 54, and laterally wider areas to reduce the corresponding electric fields attendant with higher voltages applied to bipolar devices used in high voltage and analog applications On the other hand, for high performance and high speed bipolar devices, the base region 54 should be thin and the implant dosage should be at a minimum.

Figure 6:
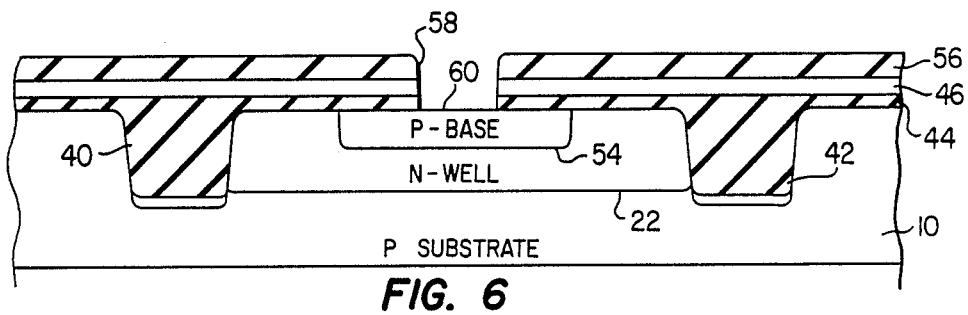

The photoresist 48 is then removed, and a new layer 56 is spread on the wafer and patterned to define an opening 58 for locating the emitter region in the semiconductor base region 54. Because the emitter is centered within the base region 54, the former becomes "nested" with respect to the intrinsic base 54. As noted in FIG. 6, the gate oxide 44 and the thin polysilicon 46 are etched, thereby exposing a portion of the face of the intrinsic base region 54. The window 60 which defines the exposed portion of the intrinsic base region 54 also defines the effective emitter area which will subsequently form a junction in the base region 54. The window 60 may be subjected to a deglazing process, wherein a clean surface on the intrinsic base region 54 is obtained.

Figure 7:
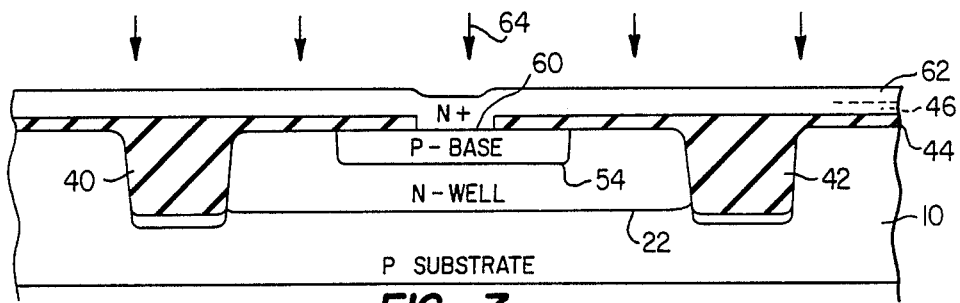

With regard to FIG. 7 of the drawings, a much thicker layer of polysilicon 62 is deposited over the surface of the wafer. The polysilicon layer 62 merges with that of the first layer 46 and forms a homogeneous layer of polysilicon, preferably of about 4,000 angstroms thick. As noted in FIG. 7, the polysilicon 62 makes contact in the window 60 with the underlying semiconductor intrinsic base region 54. The composite polysilicon layer 62 is implanted 64 with an N-type impurity, such as arsenic or phosphorus, and at a dosage to achieve a heavily doped structure.

In the event the bipolar transistor of the invention is constructed without regard to the simultaneous fabrication of corresponding MOSFET devices, the two layers of polysilicon 46 and 62 need not be deposited separately, rather a single thick layer can be deposited in the step shown in FIG. 7. In other words, without the need for MOSFET gate structures, the integrity of the gate oxide is not as critical, and thus the passivation function of the first thin polysilicon layer 46 is thus not required.

Figure 8:
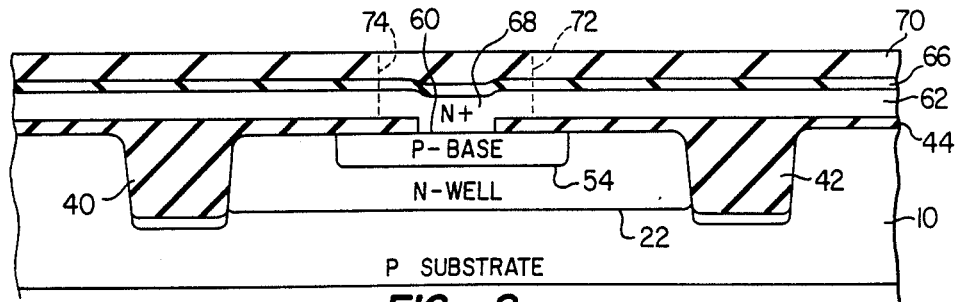

With reference now to FIG. 8, a photoresist material 70 is spread over the wafer and patterned to define the polyemitter 68. The photoresist material 70 is removed in the areas lying outside the dotted lines 72 and 74. The periphery of the gate structures of the PMOS and NMOS devices are similarly defined. The polysilicon 62 is also removed in the areas lying outside the dotted lines 72 and 74 by a conventional etching process. The polyemitter 68 and the MOSFET transistor gate structures (not shown) are thus defined.

Figure 9:
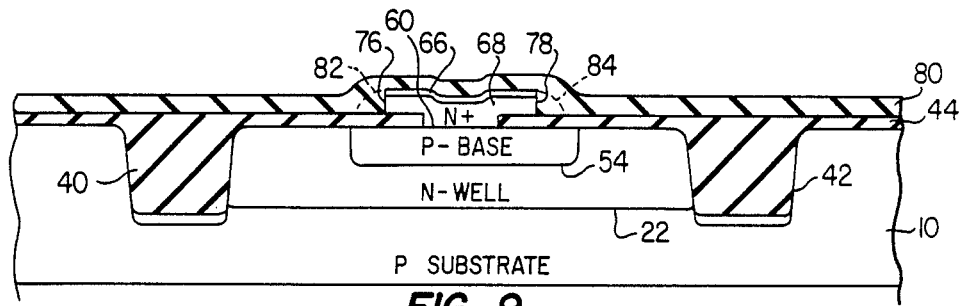

FIG. 9 illustrates the polyemitter 68 located with respect to the P-type base region 54. Importantly, the polyemitter 68 contacts the intrinsic base region 54 at the window area 60 formed in the gate oxide 44. Equally as important, the periphery of the base region 54 extends outwardly beyond the sidewall 76 and 78 of the polyemitter 68. This is important so that a subsequently formed extrinsic base region and collector region can be formed contiguous with the intrinsic base region 54, and self aligned with respect to the polyemitter 68. To that end, the P-type intrinsic base region 54 can extend further laterally than shown, and even across the entire face of the N-well 22.

After the polyemitter 68 has been defined, together with the MOSFET transistor gate conductors, a thick layer of silicon oxide 80 is deposited over the surface of the wafer. The oxide 80 can be deposited using LPCVD techniques to form a conformal layer of insulating silicon oxide, as noted in FIG. 9. The deposited silicon oxide 80 is anisotropically etched in the downward direction, such as by a reactive ion etching process. The etch process is allowed to proceed until a layer of silicon oxide has been removed in a downward direction to a depth substantially equal to the thickness of such oxide layer 80. Because of the anisotropic removal of the silicon oxide 80, all that remains is that which is shown by the broken lines and identified by reference characters 82 and 84. The anisotropic nature of the etch process is not effective in removing all the silicon oxide on the sidewalls of the polyemitter 68, as the silicon oxide is much thicker in this area, as measured vertically, than in other areas, such as that overlying the polyemitter 68 or the field oxide areas 40 and 42.

An optional layer of silicon nitride (not shown) can be deposited over the polyemitter 68 to function both as a sacrificial layer during the anisotropic etch, and as a blocking layer to prevent the passage therethrough of ions during subsequent ion implants. The optional nitride layer would be deposited on the polysilicon 62 and patterned prior to the depositing of the photoresist 70.

The polysilicon gate conductors of the MOSFET transistors formed during the fabrication of the exemplary bipolar transistor would also include similar accumulations of insulating silicon oxide on the sidewalls thereof. As noted above, the sidewall oxide on the NMOS transistor gate conductor facilitates the fabrication of lightly doped drain areas, which are important to the operation of small area NMOS devices.

Figure 10:
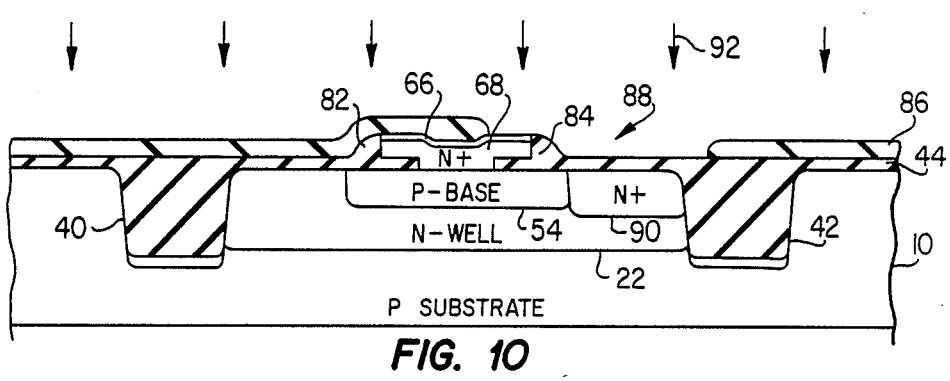

FIG. 10 illustrates the polyemitter 68 peripherally bounded with the sidewall oxide 82 and 84. The wafer is also shown with a layer of photoresist 86, patterned to form an opening 88 defining a collector region location in the N-well 22. The thin oxide 44 overlying the collector region can be optionally thinned or removed before the implant. An ion implant 92 is conducted over the wafer, using phosphorus or arsenic to form an N+ collector region 90 in the N-well 22. The N+ collector region 90 is contiguous with the base region 54. That portion of the intrinsic base region 54 which extended laterally beyond the outer edge of the sidewall oxide 84 is compensated, or counterdoped, by the opposite implant impurity, such that it becomes a part of the N+ collector region 90. Alternately, by precise pattern aligning, the intrinsic base region could have been terminated before extending into the collector region. This would result in lower parasitic capacitances, and would increase breakdown voltage capability.

As noted in FIG. 10, the collector region 90 is self aligned with respect to the polyemitter sidewall oxide 84, and contiguous with the intrinsic base region 54. Moreover, the mask alignment of the photoresist layer 86 is not critical, except insofar as the peripheral edge of the opening 88 should generally overlay the thick field oxide 42 and the polyemitter 68. Depending on the patterning of the photoresist 86 to locate the edge thereof covering the polyemitter 68, the N-type implant impurity may enter the polyemitter 68. This is inconsequential, as the implant impurity and that of the polyemitter 68 are the same. At the same time the N+ collector region 90 is formed, corresponding source and drain regions may be formed in the NMOS transistors.

Figure 11:
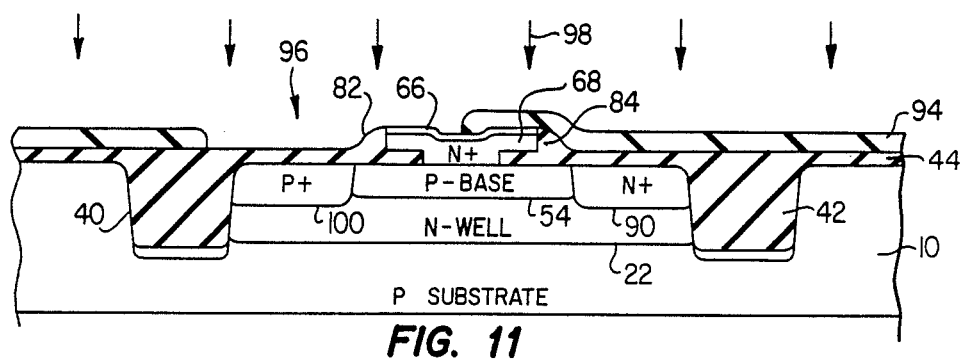

Referring now to FIG. 11, the photoresist mask 86 is removed, and an additional layer of photoresist material 94 is spread over the surface of the wafer. The photoresist 94 is patterned to define an opening 96 for locating an extrinsic base region within the N-well 22. The alignment of the photoresist mask 94 in forming an extrinsic base region is somewhat more critical than the mask used in forming the collector region. The ion implant 98 may drive some P+ ions into the N polyemitter 68. However, in the nested type of polyemitter, a portion of the oxide 44 separates the polysilicon emitter from the intrinsic base region 54 and thus the P-type impurities are driven into a noncritical location of the polyemitter 68. The optional nitride layer referred to above would prevent the P-type implant 98 from affecting the N-type polyemitter 68.

The extrinsic base region 100 is provided primarily for forming an electrical connection to the intrinsic base region 54. The active transistor action of the bipolar transistor occurs in the intrinsic base region 54, as such semiconductor region is between the collector 90 (and N-well 22) and an emitter region to be subsequently formed.

A P-type impurity, such as boron, is implanted 98 into the opened areas of the wafer, thereby forming a P+ extrinsic base region 100 in the bipolar transistor. In a similar manner, source and drain openings can be formed in the photoresist mask 94 in the PMOS transistor area, and implanted at the same time as the bipolar transistor. The photoresist layer 94 is then removed.

As noted in FIG. 11, the extrinsic base region 100 is self aligned with respect to the polyemitter sidewall oxide 82. Significantly, both semiconductor regions 90 and 100 are self aligned with respect to the polyemitter 68, including the sidewall oxide 82 and 84. With the noted polyemitter structure, there can be some variance in the location of the emitter opening in the thin gate oxide 44 without causing concern that the emitter region, which is centered at the oxide opening, will encroach into either the extrinsic base 100 or the collector 90. The distance between the oxide opening edge and the collector region 90 is related to the emitter-collector breakdown voltage and the gain of the bipolar transistor. In both the nested and walled emitter type of structures, the sidewall oxide 84 assures that when the regions are implanted or otherwise formed, a minimum distance will exist between the emitter region and the collector region. Of course, lateral diffusion of the emitter and collector regions can have an effect on the spacing there between.

Figure 12:
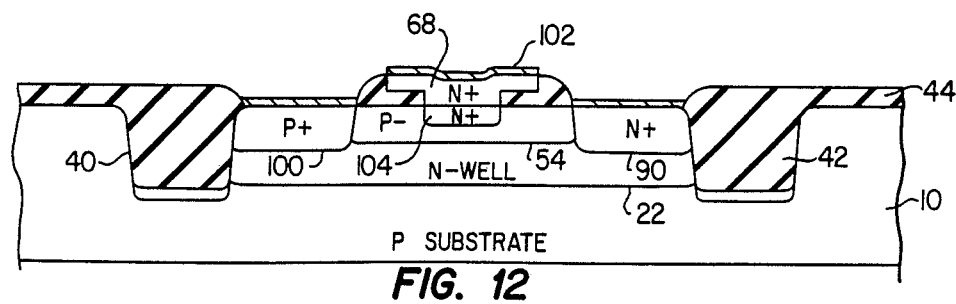

The bipolar transistor collector region 90 and the extrinsic base region 100 are patterned (not shown), and the gate oxide 44 located thereover is removed. In like manner, the gate oxide on the source and drain regions of the MOSFET transistors is also removed. The surface of the wafer is then covered with a layer 102 of titanium and patterned, as indicated in FIG. 12. In certain situations where only bipolar transistors are to be formed, a layer of platinum can be used. In FIG. 12, the collector region 90 and extrinsic base region 100 are shown covered with the titanium metal. The polyemitter 68 is also shown covered with a conductive coating of titanium 102.

In accordance with conventional silicon processing techniques, the wafer is then heated to form titanium silicide over the regions previously covered with titanium. It may be preferable to react the titanium in a nitrogen ambient for also forming a conductive titanium nitride. The excess titanium existing after the reaction with the silicon to form the silicide is then removed. The titanium metal layer 102 is etched so that only the electrical contact surfaces of the bipolar and MOSFET transistors are covered with such metal. The elevated temperature of the wafer is also effective in diffusing the N+ impurity in the polyemitter 68 down into the intrinsic base region 54, thereby forming an N+ emitter region 104 in the bipolar transistor. In the event platinum is used in place of titanium, the anneal treatment can be performed before deposition of platinum The formation of the emitter in this manner forms a buried emitter contact between the polyemitter 68 and the semiconductor emitter region 104. External electrical contact is not made directly to the emitter region 104, but rather through the conductive polyemitter 68.

FIG. 13 depicts the wafer in substantially completed form, with the titanium silicide 106 and 108 covering the respective extrinsic base region 100 and the collector region 90. A titanium silicide layer 110 also covers the top of the polyemitter 68 for providing a good electrical contact thereto. A layer of insulation 112 is then deposited over the surface of the wafer and patterned to form openings to the silicide interfaces of the collector region 90 and the extrinsic base region 100. While not shown in FIG. 13, an opening is also formed in the insulation 112 to the polyemitter 68 at an off-site location. A layer of metal is deposited over the wafer and patterned to form a collector conductor 114, a base conductor 116 and an emitter conductor.

A top view of the wafer structure of FIG. 13 is shown in FIG. 14. The polyemitter 68 is shown with an off-site extension pad 118 formed over a field oxide region 120 of the wafer. An electrical contact 122 is formed in contact with the polyemitter extension pad 118. As a result, the emitter contact 122 is also in electrical contact through the polyemitter 68 with the buried emitter 104. As can be seen from FIG. 14, the emitter 104 is nested within the base region 54, in a position defined by the contact area of the polyemitter 68 with respect to the base region 54.

The foregoing illustrates the fabrication and resulting structure of an NPN bipolar transistor. Those skilled in the art can utilize the description herein for fabricating a PNP bipolar transistor. Various semiconductor impurity regions will need to be changed, and perhaps the impurity concentrations, to achieve a PNP transistor with suitable operating characteristics. Also, when fabricating MOSFET transistors with PNP bipolar transistors, the gate conductor doping impurities may require changing.

FIGS. 15 and 16 illustrate respectively cross-sectional and top views of a walled emitter bipolar transistor 124. A bipolar transistor constructed according to this embodiment does not have an emitter opening in the base region 54 nested under and recessed from the edges of the polyemitter 68. Rather, the polyemitter 126 has a width substantially equal to the corresponding width of the emitter region 128, and is in full contact therewith. When the N-type impurities are diffused from the polyemitter 126 into the intrinsic base region 54, a large area emitter 128 is thereby formed. Even though the same self-aligning features exist with respect to the formation of the transistor 124, as compared with that previously described, bipolar transistor 124 can be made using a smaller wafer area. Because the buried emitter 128 need not be nested with respect to the polyemitter 126, a transistor using less wafer area can be formed. As with the embodiment shown in FIG. 14, the transistor 124 of FIG. 16 includes an off-site emitter contact 144.

In FIG. 17, a bipolar transistor structure similar to that of FIG. 13 is illustrated, but further includes a Schottky-clamped base-collector junction. To that end, a portion 146 of the N-well 22 is formed at the face of the wafer, adjacent the extrinsic base region 100. A conductive silicide 148 overlies both the N-well surface portion 146 and the extrinsic base 100, thereby forming a metal barrier contact therebetween. As a result, the base-collector junction of the bipolar transistor has formed in parallel thereto a Schottky diode, and thus the transistor is prevented from becoming saturated when driven into a conductive state.

TECHNICAL ADVANTAGES OF THE INVENTION

From the foregoing, the fabrication steps and resulting structure of a bipolar transistor have been disclosed. A technical advantage of the bipolar transistor fabrication of the invention is that it can be constructed using steps compatible with the formation of MOSFET transistors. Therefore, an attendant technical advantage of the invention is that MOSFET transistors and bipolar transistors of the invention can be fabricated jointly on a wafer and thereby simplify the integration of bipolar and MOSFET transistors.

Another technical advantage of the invention presented is that by using MOSFET fabrications techniques, a self aligned bipolar transistor can be constructed using very little wafer area. As a result, the electrical operation of the bipolar transistor is enhanced, insofar as there is less parasitic capacitance, and the resultant high frequency operation thereof is extended.

Yet another technical advantage of the invention enables the construction of nested and walled polyemitter bipolar transistors. The fabrication steps are simplified in that the extrinsic base and collector regions thereof are formed on opposing sides of the polyemitter and self aligned with respect to the edges of the polyemitter. Sidewall oxide formed on the polyemitter presents the technical advantage of spacing the corresponding collector and extrinsic base regions from the emitter, thereby assuring that junction punchthrough is avoided.

Still another technical advantage of the invention exists in that a Schottky-clamped bipolar transistor is easily fabricated, using MOSFET transistor compatible fabrication steps.

While the preferred embodiment of the invention has been disclosed with reference to specific bipolar transistor structures and methods of fabrication, it is to be understood that many changes in detail may be made as a matter of engineering choices without departing from the spirit and scope of the invention, as defined by the appended claims.

What is claimed is:

1. A method of fabricating a bipolar transistor, comprising the steps of:
   forming a semiconductor well of a first conductivity type at the face of a semiconductor body;
   forming a semiconductor base region of a second conductivity type in said semiconductor well;
   forming a polycrystalline silicon emitter structure of said first conductivity type in contact with said semiconductor base region, said emitter structure having sidewalls;
   forming a single layer of insulation on said polycrystalline silicon emitter structure and selectively removing said insulation without a mask from planar surfaces to concurrently form single layer sidewall insulation on said sidewalls of said polycrystalline silicon emitter structure;
   forming a semiconductor collector region of a first conductivity type in said well contiguously self aligned with respect to said insulation for said emitter structure;
   forming a semiconductor extrinsic base region of said second conductivity type in said well and self aligned with respect to said insulation for said emitter structure, and extrinsic base region contiguous with said semiconductor base region; and
   providing an impurity of said first conductivity type into said base regions to thereby form a semiconductor emitter region of said first conductivity type.

2. The method of claim 1 further including forming a temporary blocking layer of material covering said emitter structure to prevent undesired impurities of an opposite conductivity type from entering said emitter structure.

3. The method of claim 1 further including forming an insulation between said emitter structure and said semiconductor base region, and forming an opening in said insulation and forming said emitter structure through said opening in contact with said semiconductor base region.

4. The method of claim 1 further including forming said base region and said collector region at the face of said semiconductor body, and forming a conductive silicide covering said base region, said collector region and a portion of said polycrystalline silicon emitter structure to provide electrical contact surfaces.

5. The method of claim 4 further including forming a portion of said semiconductor well at the face of said semiconductor body adjacent said base region, and forming a metallic covering a portion of both said semiconductor well and said base to thereby form a barrier diode in parallel with a base-collector junction of said bipolar transistor.

6. The method of claim 3 further including forming a MOSFET device gate insulator with said insulation, and forming a gate conductor with the material of said emitter structure.

7. The method of claim 6 further including forming said gate insulator at the same time as said emitter insulation is formed, and forming said gate conductor at the same time as said emitter structure is formed.

8. The method of claim 6 further including forming a sidewall insulation on said emitter structure at the same time and by the same steps as a corresponding sidewall insulation is formed on said gate conductor.

9. The method of claim 6 further including forming a source and a drain region of first type of MOSFET device when said extrinsic base region is formed, and forming source and drain regions of a second type of MOSFET device when said collector region is formed.

10. A method of forming self-aligned semiconductor regions in a bipolar transistor, comprising:
    forming a semiconductor base region in the face of a substrate;
    forming a doped polycrystalline silicon layer in contact with said base region at a location to define an emitter region;
    forming said polycrystalline silicon with an edge extending laterally beyond said emitter region;
    diffusing the dopant of said polycrystalline silicon into said base region to form said emitter region; and
    forming a single layer of insulator on said polycrystalline silicon layer and selectively removing said insulator without a mask from planar surfaces to concurrently form single layer sidewall insulator on said edge of said polycrystalline silicon; and
    forming said collector contiguously aligned with said insulator.

11. The method of claim 10 further including forming insulator underlying a peripheral edge of said polycrystalline silicon.

12. The method of claim 11 further including forming said insulator underlying said polycrystalline silicon so as to define an opening in said insulator, and forming said polycrystalline silicon in said opening in contact with said base region.

13. The method of claim 10 wherein said polycrystalline silicon edge defines a first edge, and further including forming a second edge on said polycrystalline silicon and forming an extrinsic base region in said substrate aligned with said second edge and contiguous with said base region.

14. A method of forming emitter and gate structures on a semiconductor body, comprising the steps of:
    forming a semiconductor base region in a face of said semiconductor body;
    forming an oxide layer over said semiconductor body;
    depositing a first polysilicon layer over said oxide layer;
    forming an opening in said oxide layer and said first polysilicon layer to expose a portion of said base region; and
    depositing a second polysilicon layer directly over and contiguous with substantially all of said first polysilicon layer and patterning, to concurrently define separate Bipolar emitter and MOSFET gate structures, said structures including sidewalls.

15. The method of claim 14 wherein said emitter structure is defined in the previously exposed portion of said base region.

16. The method of claim 14 wherein said polysilicon layer is doped.

17. The method of claim 16 wherein said dopant in said polysilicon layer is diffused into an underlying base region to form an emitter region.

18. The method of claim 14 further including forming insulation on said sidewalls and forming collector and base regions self aligned with said insulation.

19. The method of claim 14 wherein said oxide layer is comprised of thin gate oxide.

20. A method of fabricating bipolar transistor structures comprising the steps of:
    providing a semiconductor body;
    forming an oxide layer over said semiconductor body;
    forming an opening in said oxide layer to expose an portion of said semiconductor body;
    forming a bipolar semiconductor structure on said semiconductor body portion exposed by said opening in, said bipolar semiconductor structure having sidewalls extending partially onto said oxide layer such that oxide is disposed between said sidewalls and said semiconductor body;
    forming a single layer of insulation on said emitter structure and selectively removing said insulation without a mask from planar surfaces to concurrently form single layer sidewall insulator on said sidewalls of said structure;
    forming a bipolar semiconductor region self-aligned with respect to said sidewall insulation for said bipolar semiconductor structure, said sidewall insulation and said oxide layer disposed between said sidewalls and said semiconductor body combining to separate said bipolar semiconductor structure and said bipolar semiconductor region.

* * * * *

UNITED STATES PATENT AND TRADEMARK OFFICE
CERTIFICATE OF CORRECTION

PATENT NO. : 4,962,053

DATED : October 9, 1990

INVENTOR(S) : David Spratt; Rajiv R. Shah

It is certified that error appears in the above-identified patent and that said Letters Patent is hereby corrected as shown below:

ON THE TITLE PAGE:   Item [21]
   Please delete "Appl. No.: 296,493" and insert --Appl. No.: 296,403--.

Signed and Sealed this

Twelfth Day of May, 1992

Attest:

DOUGLAS B. COMER

*Attesting Officer*   *Acting Commissioner of Patents and Trademarks*